United States Patent
Hsu et al.

(10) Patent No.: US 9,130,156 B2
(45) Date of Patent: Sep. 8, 2015

(54) PROCESS TO REMOVE FILM FROM SEMICONDUCTOR DEVICES

(71) Applicant: Taiwan Semiconductor Manufacturing Company, Ltd., Hsin-Chu (TW)

(72) Inventors: Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/763,318

(22) Filed: Feb. 8, 2013

(65) Prior Publication Data

US 2014/0227802 A1    Aug. 14, 2014

(51) Int. Cl.
*H01L 21/00* (2006.01)
*H01L 43/12* (2006.01)

(52) U.S. Cl.
CPC ..................... *H01L 43/12* (2013.01)

(58) Field of Classification Search
CPC .................. H01L 43/00; H01L 43/12
See application file for complete search history.

(56) References Cited

U.S. PATENT DOCUMENTS

| 6,965,138 | B2 | 11/2005 | Nakajima et al. |
| 7,993,535 | B2 * | 8/2011 | Jiang et al. ............... 216/17 |
| 2009/0078927 | A1 | 3/2009 | Xiao et al. |
| 2010/0219493 | A1 | 9/2010 | Li |
| 2010/0258886 | A1 | 10/2010 | Wang et al. |
| 2011/0089507 | A1 | 4/2011 | Mao |
| 2011/0256642 | A1 | 10/2011 | Matsui et al. |
| 2012/0028373 | A1 | 2/2012 | Belen et al. |
| 2013/0119494 | A1 | 5/2013 | Li et al. |
| 2014/0227801 | A1 | 8/2014 | Hsu et al. |
| 2014/0227804 | A1 | 8/2014 | Hsu et al. |

* cited by examiner

*Primary Examiner* — Richard Booth
(74) *Attorney, Agent, or Firm* — Slater & Matsil, L.L.P.

(57) ABSTRACT

Embodiments of the present disclosure are a method of forming a semiconductor device, a method of forming an MRAM device, and a method of forming a semiconductor device. An embodiment is a method of forming a semiconductor device, the method comprising forming a second layer over a first layer, and performing a first etch process on the second layer to define a feature, wherein the first etch process forms a film on a surface of the feature. The method further comprises performing an ion beam etch process on the feature, wherein the ion beam etch removes the film from the surface of the feature.

20 Claims, 11 Drawing Sheets

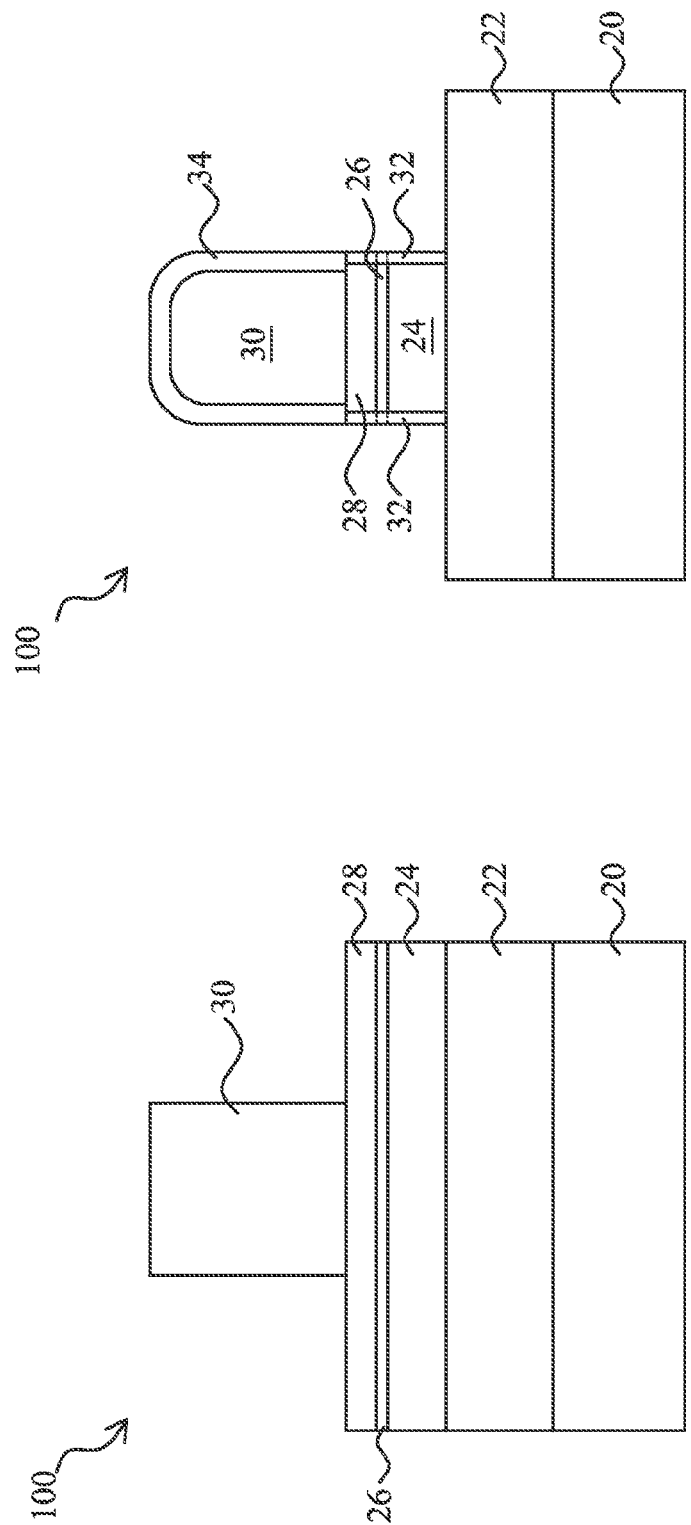

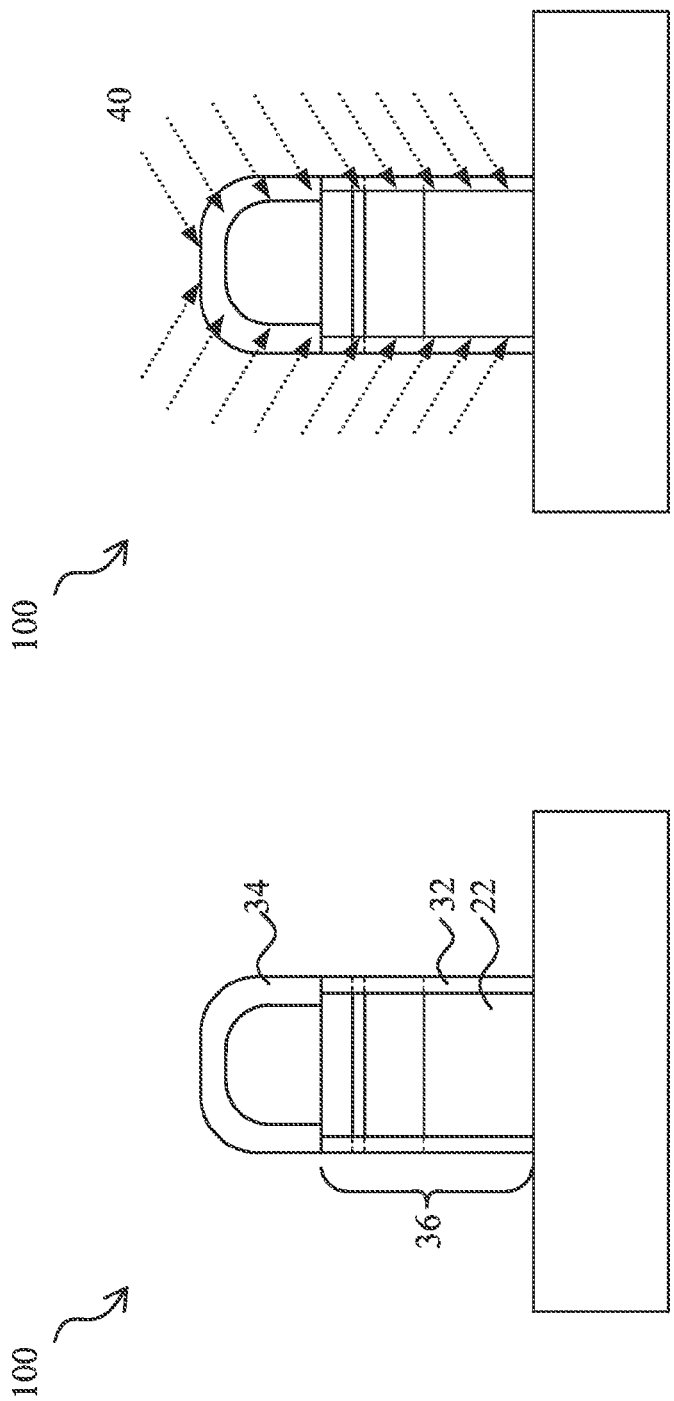

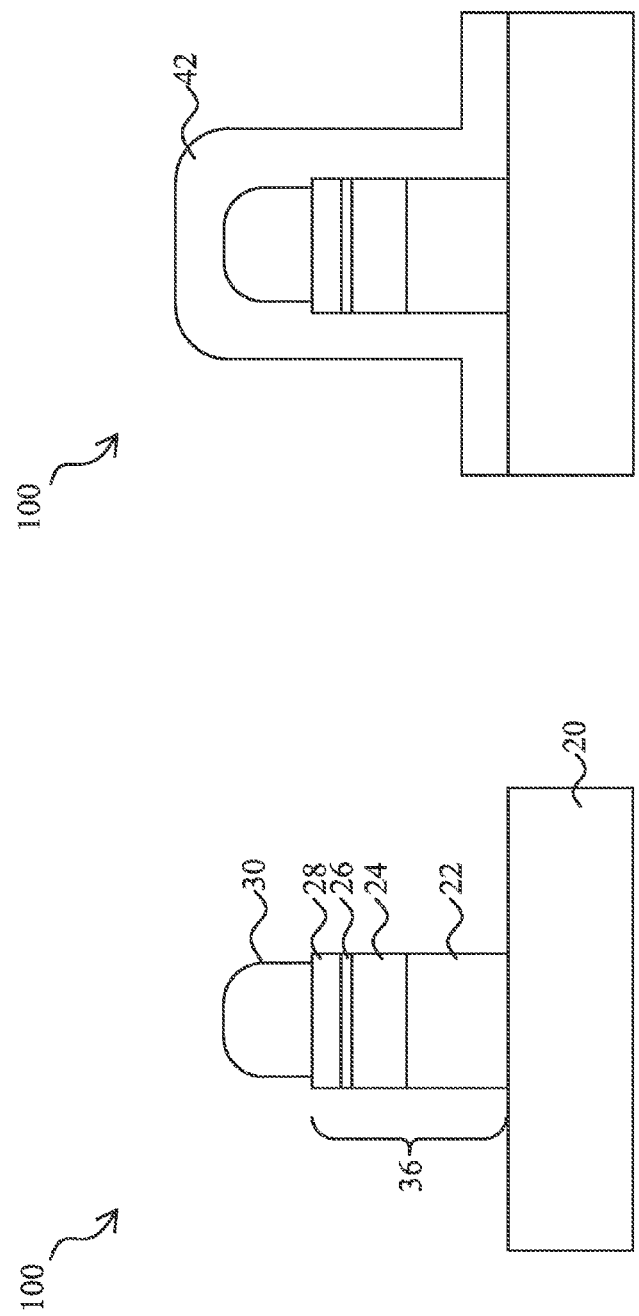

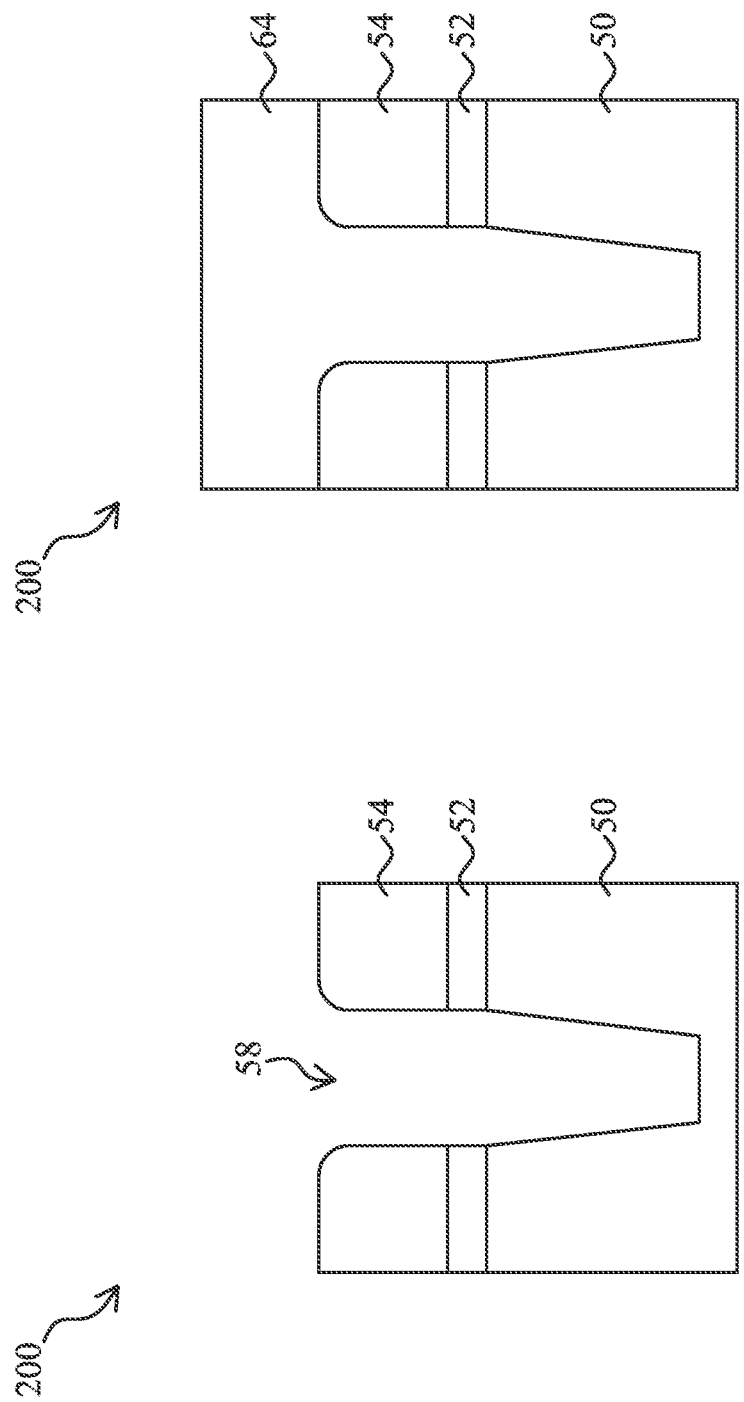

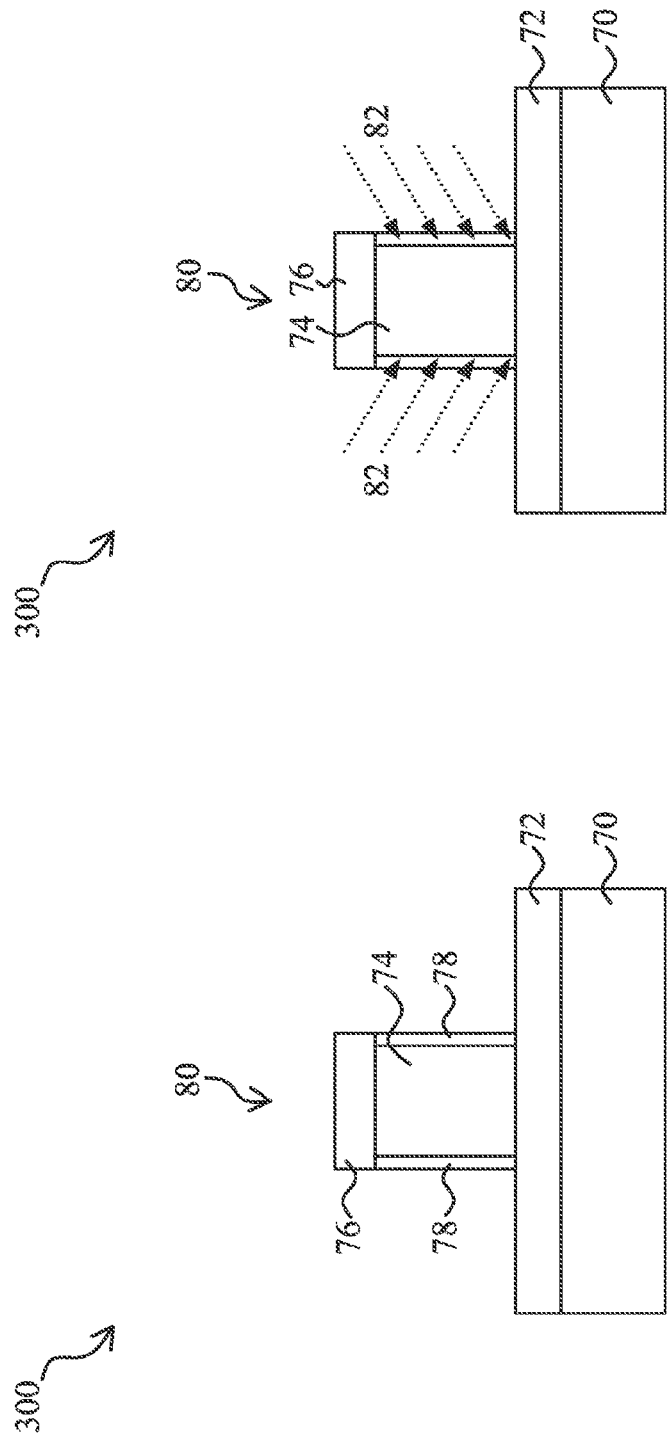

PROCESS TO REMOVE FILM FROM SEMICONDUCTOR DEVICES

BACKGROUND

Semiconductor storage devices are used in integrated circuits for electronic applications, including radios, televisions, cell phones, and personal computing devices. Commonly known storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One such spin electronic device is a spin torque transfer (STT) magnetic tunneling junction (MTJ) device.

Generally, an MTJ device includes free layer, pinned layer, and a tunnel layer interposed between the free layer and the pinned layer. The magnetization direction of the free layer can be reversed by applying a current through the tunnel layer, which causes the injected polarized electrons within the free layer to exert spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flowing through the tunnel layer, and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization as the magnetization direction of the pinned layer are able to flow through the tunnel layer and into the pinned layer. Conversely, electrons with a polarization differing from the magnetization of the pinned layer will be reflected (blocked) by the pinned layer, and will accumulate in the free layer. Eventually, magnetization of the free layer becomes anti-parallel to that of the pinned layer, and the MTJ device will be at a high-resistance state. The respective electron injection caused by current is referred to as a minor injection.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 6 illustrate intermediate stages of forming a magnetic random access memory (MRAM) device in accordance with an embodiment;

FIGS. 7 through 12 illustrate intermediate stages of forming an isolation region in accordance with an embodiment;

FIGS. 13 through 18 illustrate intermediate stages of forming a gate structure in accordance with an embodiment;

FIG. 19 illustrates a flow diagram of a method for manufacturing an MRAM device in accordance with an embodiment;

DETAILED DESCRIPTION OF ILLUSTRATIVE EMBODIMENTS

Figure 8:
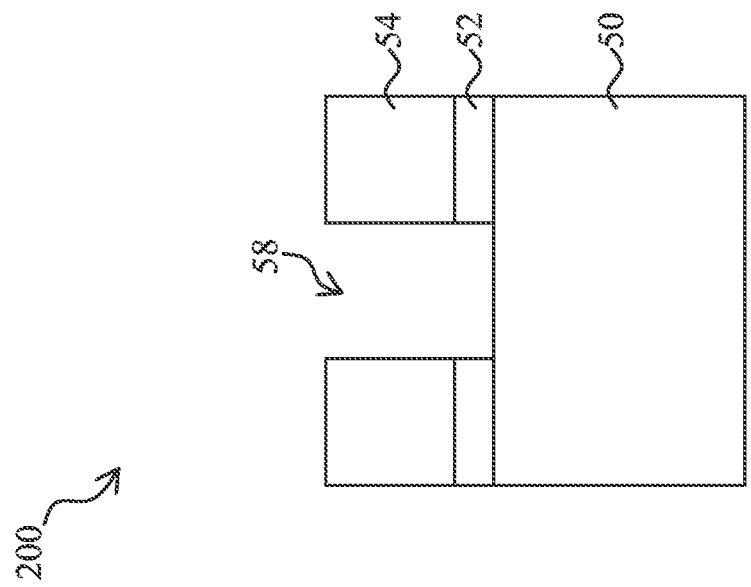

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method for forming a magnetic random access memory (MRAM) magnetic tunnel junction (MTJ) with improved performance and electrical characteristics. Other embodiments may also be applied, however, to other methods of forming semiconductor devices wherein a damaged layer or film may be removed to improve the semiconductor device.

FIG. 19 illustrates a flow diagram of a method 500 for manufacturing a MRAM device in accordance with an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502, an MTJ and a top electrode are formed over a bottom electrode. Step 502 is illustrated in FIGS. 1 through 3 as described below.

With reference now to FIG. 1, there is shown an MRAM device 100 at an intermediate stage of manufacturing. The MRAM device 100 includes a bottom electrode 20, a magnetic tunnel junction (MTJ) 36 (see FIG. 3) over the bottom electrode 20, and a top electrode 30 over the MTJ 36. The MTJ 36 comprises an anti-ferromagnetic material (AFM) layer 22 over the bottom electrode 20, a pinned layer 24 over the AFM layer 22, a barrier layer 26 over the pinned layer 24, and a free layer 28 over the barrier layer 26.

The bottom electrode 20 may be formed in a dielectric layer (not shown) by a suitable process, including a damascene process. Other processes, such as deposition and etching, dual damascene, and the like, may also be used. The bottom electrode 20 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The bottom electrode 20 may include a barrier/adhesion layer (not shown) to prevent diffusion and provide better adhesion between the bottom electrode 20 and the surrounding dielectric layers (not shown). The bottom electrode 20 may be formed, for example, by chemical vapor deposition (CVD), physical vapor deposition (PVD), atomic layer deposition (ALD), spin-on deposition, or other suitable methods.

The AFM layer 22 may be formed over the bottom electrode 20. The AFM layer 22 may be formed of PtMn, IrMn, the like, or a combination thereof. The AFM layer 22 may be deposited through a process such as CVD, PVD, ALD, the like, or a combination thereof to a thickness between about 80 Å and about 200 Å.

The pinned layer 24 may be formed over the AFM layer 22. The pinned layer 24 may be formed of any suitable ferromagnetic material or alloys that include iron such as CoFe, CoFeB, the like, or a combination thereof. The pinned layer 24 may also be formed of composite layers such as CoFeB/Ru/CoFeB/PtMn, the like, or a combination thereof. The pinned layer 24 may be deposited through a process such as CVD, PVD, ALD, the like, or a combination thereof to a thickness between about 30 Å and about 60 Å.

The barrier layer 26 may be formed over the pinned layer 24. The barrier layer 26 may be formed of any suitable dielectric material such as MgO, aluminum oxides (AlOx or $Al_2O_3$), the like, or a combination thereof. The barrier layer 26 may be deposited through a process such as CVD, PVD, ALD, the like, or a combination thereof to a thickness between about 1 Å and about 55 Å.

The free layer 28 may be formed over the barrier layer 26. The free layer 28 may be formed of any suitable ferromagnetic material or alloys that include iron such as CoFe, CoFeB, the like, or a combination thereof. The free layer 28 may also be formed of composite layers such as CoFeB/Ru/CoFeB/PtMn, the like, or a combination thereof. The free layer 28 may be deposited through a process such as CVD, PVD, ALD, the like, or a combination thereof to a thickness between about 10 Å and about 30 Å.

The pinned layer 24 is a ferromagnetic layer whose magnetic orientation may not be changed during operation of its associated MRAM device 100. The free layer 28 is also a ferromagnetic layer whose magnetic polarity or magnetic orientation can be changed during write operation of its associated MRAM device 100. The relative alignment of the magnetic fields of the pinned layer 24 and free layer 28 determines the resistive state (high resistance or low resistance) of the barrier layer 26 interposed between the pinned layer 24 and free layer 28. Digital information stored in an MTJ 36 (see FIG. 3) is read by detecting the resistive state of the MTJ 36.

When the magnetic orientations of the free layer 28 and pinned layer 24 are anti-parallel to each other, a first memory state exists (e.g., a logical '1'). When the magnetic orientations of the free layer 28 and pinned layer 24 are parallel to each other, a second memory state exists (e.g., a logical '0'). The magnetic orientation of the free layer 28 and pinned layer 24 can be sensed to read data stored in the MTJ 36 by sensing the resistance when current flows through the MTJ 36. To change the state of the MTJ 36, the magnetic polarity of the free layer 28 is altered by applying current to the free layer 28 to switch the magnetization of the free layer 28.

The top electrode 30 may be formed in a dielectric layer (not shown) by a suitable process, including a damascene process. Other processes, such as deposition and etching, dual damascene, and the like, may also be used. The top electrode 30 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The top electrode 30 may include a barrier/adhesion layer (not shown) to prevent diffusion and provide better adhesion between the top electrode 30 and the surrounding dielectric layers (not shown). The top electrode 30 may be formed, for example, by CVD, PVD, ALD, spin-on deposition, or other suitable methods. The locations and the shapes of the top electrode 30 and the bottom electrode 20 are provided for illustrative purposes only and are not limiting.

As illustrated in FIG. 2, the free layer 28, the barrier layer 26, and the pinned layer 24 have been patterned to have a width substantially the same as the top electrode 30. In an embodiment, the free layer 28, the barrier layer 26, and the pinned layer 24 may be patterned by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like.

The etch process described above forms a MTJ sidewall film 32 on the sidewalls of the MTJ 36 (see FIG. 3) and a top electrode film 34 on the top and sidewalls of the top electrode 30. The MTJ sidewall film 32 may be caused by damage from the etch process to the sidewalls of the MTJ 36, the oxidation of the sidewalls of the MTJ 36, the re-deposition of etching by-product on the sidewalls of the MTJ 36, or a combination thereof. The top electrode film 34 may be caused by damage from the etch process to the top and sidewalls of the top electrode 30, the oxidation of the top and sidewalls of the top electrode 30, the re-deposition of etching by-product on the top and sidewalls of the top electrode 30, or a combination thereof.

FIG. 3 illustrates the patterning of the AFM layer 22 to form the MTJ 36. The AFM layer 22 may be patterned to have a width substantially the same as the top electrode 30, the free layer 28, the barrier layer 26, and the pinned layer 24. The AFM layer 22 may be patterned by a similar etch process as the free layer 28, the barrier layer 26, and the pinned layer 24. The etching of the AFM layer 22 may cause further damage, oxidation, and re-deposition of etching by-product to further increase the thickness of the MTJ sidewall film 32 and the top electrode film 34. The MTJ sidewall film 32 and the top electrode film 34 may impact the electrical behavior of the MRAM device 100 by causing, for example, MTJ leakage around the barrier layer 26 via the MTJ sidewall film 32.

At step 504 of FIG. 19, an IBE treatment is performed on the MTJ 36 and the top electrode 30 to remove the MTJ sidewall film 32 and the top electrode film 34. Step 504 is illustrated in FIGS. 4 and 5 as described below.

The MTJ sidewall film 32 and the top electrode film 34 may be removed by an ion beam etching (IBE) process 40 as illustrated in FIG. 4. The IBE process 40 may comprise an etchant gas such as a CHF series ($CHF_2$, $CHF_3$, or $CHF_4$), Ar, O, N, the like, or a combination thereof. The angle of incidence of the ions during the IBE process 40 may be controlled and modified to remove the MTJ sidewall film 32 and the top electrode film 34. The IBE process 40 generates a neutralization species as the etchant and will not damage and/or oxidize the top electrode 30 and the sidewalls of the MTJ 36.

The IBE process 40 may be performed in a chamber with a rotatable stage or substrate table with more than one axis of rotation. This rotation allows a more uniform etch profile and allows control of the angle of incidence of the ion beam. The ions may be extracted from the etchant gas, accelerated, and focused by one or more electrically biased grids. For example, a first grid with a voltage between about 100 V and about 200 V may extract the ion and accelerate it towards the substrate to be etched. A second grid with a voltage between about 500 V to about 2000 V may focus the trajectory of the ion with a third grid with a voltage between about 100 V and about 200 V preventing the ion from back-streaming to the second grid. In this example, the ion beam voltage would be the same as the voltage of the first grid. The IBE process 40 may also have an end point detection system (not shown) to allow the etching process to stop after the MTJ sidewall film 32 and the top electrode film 34 are removed.

As illustrated in FIG. 5, substantially all of the MTJ sidewall film 32 and the top electrode film 34 are removed by the IBE process 40. The removal of the MTJ sidewall film 32 and the top electrode film 34 exposes the sidewalls of the AFM layer 22, the pinned layer 24, the barrier layer 26, the free layer 28, and the top and sidewalls of the top electrode 30.

At step 506 of FIG. 19, MTJ 36, the top electrode 30, and the bottom electrode 20 are encapsulated. Step 506 is illustrated in FIG. 6 as described below.

The top electrode 30, the MTJ 36, and the bottom electrode 20 may be encapsulated by a dielectric layer 42 as illustrated in FIG. 6. The dielectric layer 42 may blanket deposited on the top electrode 30, the MTJ 36, and the bottom electrode 20. The dielectric layer 42 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 42 may be deposited through a process such as CVD, or a spin-on-glass process, although any acceptable process may be utilized.

Various modifications may be made to the above MRAM device 100. The MRAM device 100 may be provided in any orientation or axis, including vertical (as illustrated), horizontal, or angled. Depending on the composition of the various layers and etches used, the order in which certain layers are placed or deposited can be varied. It will also be recognized that the order of layers and the materials forming those layers in the above embodiments are merely exemplary. Moreover, in some embodiments, other layers (not shown) may be placed or deposited and processed to form portions of a MRAM device 100 or to form other structures on a substrate. In other embodiments, these layers may be formed using alternative deposition, patterning, and etching materials and processes, may be placed or deposited in a different order, or composed of different materials, as would be known to one of skill in the art.

Figure 20:
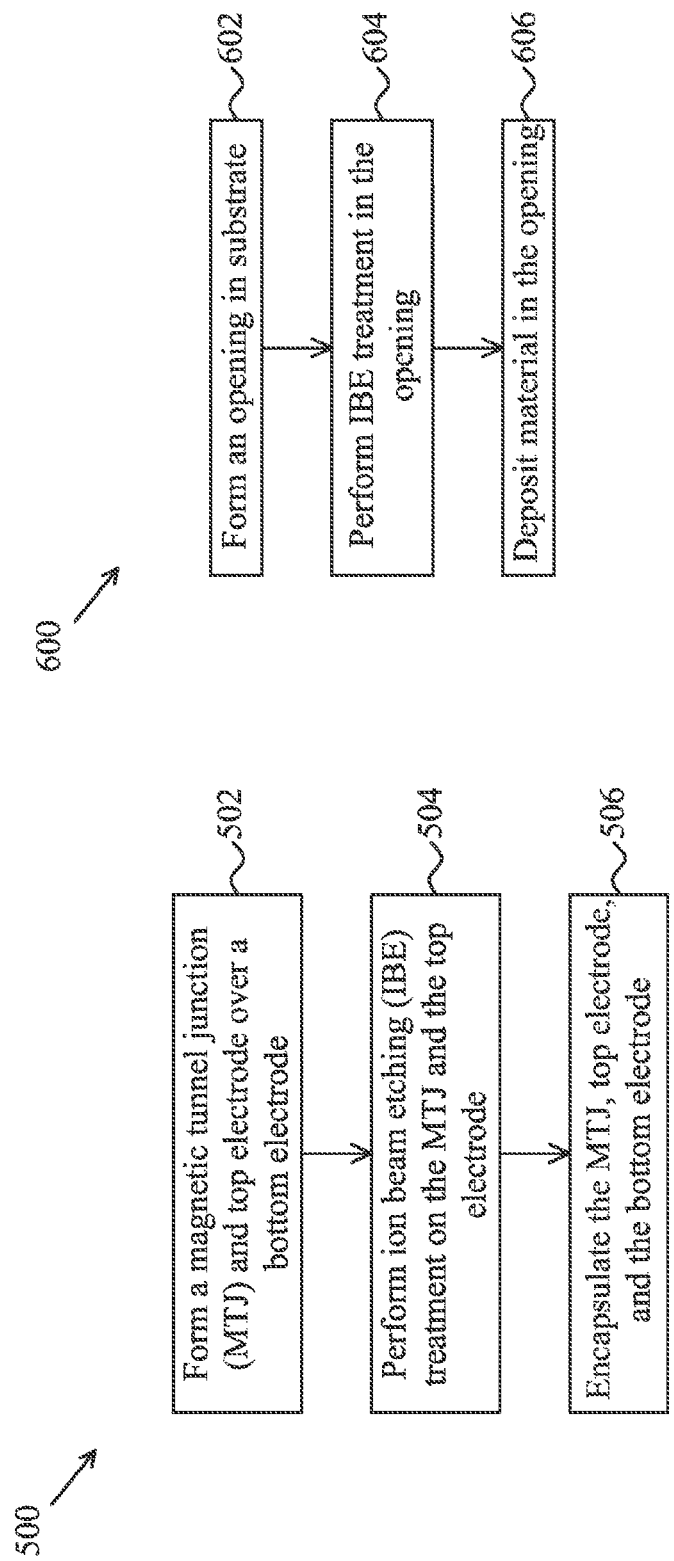
FIG. 20 illustrates a flow diagram of a method for manufacturing a semiconductor device in accordance with an embodiment.

FIG. 20 illustrates a flow diagram a method 600 for manufacturing a semiconductor device 200 in accordance with an embodiment. While method 600 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
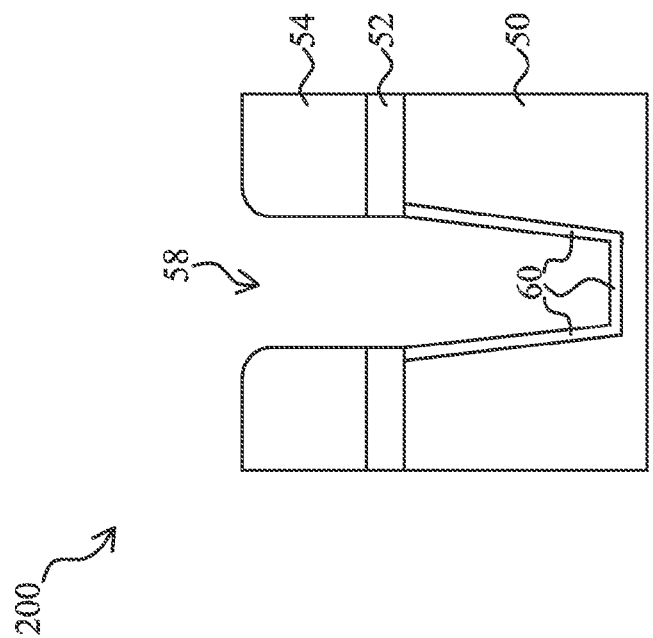

At step 602, an opening is formed in a substrate. Step 602 is illustrated in FIGS. 7 through 9 as described below.

Figure 7:
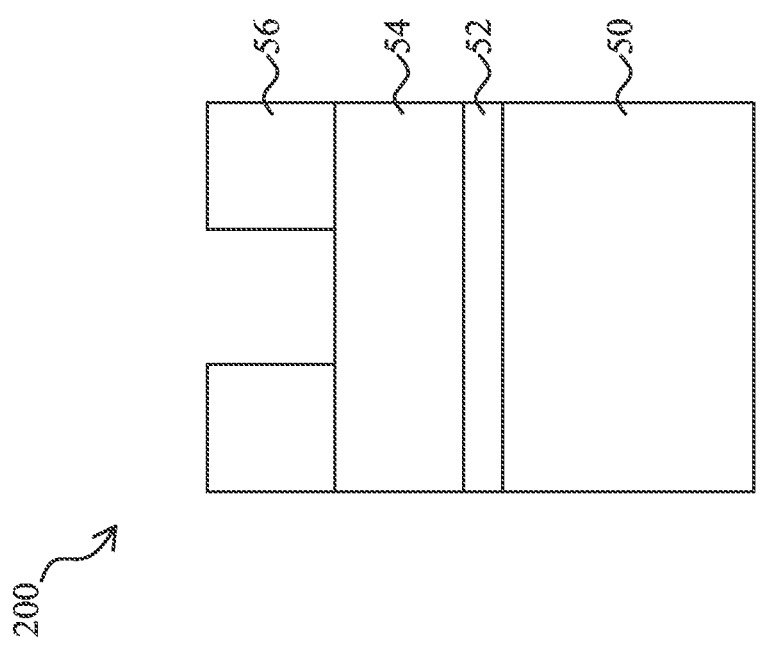

FIG. 7 illustrates a semiconductor device 200 at an intermediate stage of manufacturing. The semiconductor device 200 includes a substrate 50, a first dielectric layer 52 over the substrate 50, a second dielectric layer 54 over the first dielectric layer 52, and a photoresist 56 over the second dielectric layer 54. The substrate 50 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 50 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 50 may be doped with a p-type dopant, such as boron, aluminum, gallium, or the like, although the substrate may alternatively be doped with an n-type dopant, as is known in the art.

The substrate 50 may include active devices (not shown in FIG. 7). As one of ordinary skill in the art will recognize, a wide variety of devices such as transistors, capacitors, resistors, combinations of these, and the like may be used to generate the structural and functional requirements of the design for the semiconductor device 200. The devices may be formed using any suitable methods. Only a portion of the substrate 50 is illustrated in the figures, as this is sufficient to fully describe the illustrative embodiments.

The first dielectric layer 52 may be deposited over the substrate 50. The first dielectric layer 52 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 52 may be deposited through a process such as CVD, ALD, PVD, or a spin-on-glass process, although any acceptable process may be utilized to form the first dielectric layer 52.

The second dielectric layer 54 may deposited over the first dielectric layer 52. The second dielectric layer 54 may be formed of similar materials and similar processes as the first dielectric layer 52, although the first dielectric layer 52 and the second dielectric layer 54 need not be the same material.

The photoresist 56 may be deposited and patterned over the second dielectric layer 54. The photoresist 56 may comprise a conventional photoresist material, such as a deep ultraviolet (DUV) photoresist, and may be deposited on the surface of the second dielectric layer 54, for example, by using a spin-on process to place the photoresist 56. However, any other suitable material or method of forming or placing the photoresist 56 may alternatively be utilized. Once the photoresist 56 has been placed on the second dielectric layer 54, the photoresist 56 may be exposed to energy, e.g. light, through a patterned reticle in order to induce a reaction in those portions of the photoresist 56 exposed to the energy. The photoresist 56 may then be developed, and portions of the photoresist 56 may be removed, exposing a surface of the second dielectric layer 54.

FIG. 8 illustrates the formation of an opening 58 in the first and second dielectric layers 54 and 52. The opening 58 may be substantially aligned with the exposed portion of the second dielectric layer 54 between the patterned photoresist 56 (see FIG. 7). The opening 58 may be formed by etching the first and second dielectric layers 52 and 54. The etching of the second dielectric layer 54 and the first dielectric layer 52 may be performed by, e.g., a dry plasma etch, with etchant gas comprising $SF_6$, $CF_4$, $CHF_3$, the like, or a combination thereof.

FIG. 9 illustrates the etching of the substrate 50 to extend the opening 58 into the substrate 50. The opening 58 extending into the substrate 50 may be substantially aligned with the opening 58 in the first and second dielectric layers 52 and 54. The opening 58 may be formed by etching the first and second dielectric layers 52 and 54. The etching of the second dielectric layer 54 and the first dielectric layer 52 may be performed by, e.g., a dry plasma etch, with etchant gas comprising $SF_6$, $CF_4$, $CHF_3$, the like, or a combination thereof.

As described above in regards to the MTJ sidewall film 32 and the top electrode film 34, the etching process for forming the openings 58 may form an opening film 60 on the sidewalls and bottom of the opening 58. The opening film 60 may be caused by damage from the etch process to the sidewalls and bottom of the opening 58, the oxidation of the bottom and sidewalls of the opening 58, the re-deposition of etching by-product on the bottom and sidewalls of the opening 58, or a combination thereof.

At step 604 of FIG. 20, an IBE treatment is performed in the opening 58 to remove the opening film 60. Step 604 is illustrated in FIGS. 10 and 11 as described below.

Figure 10:
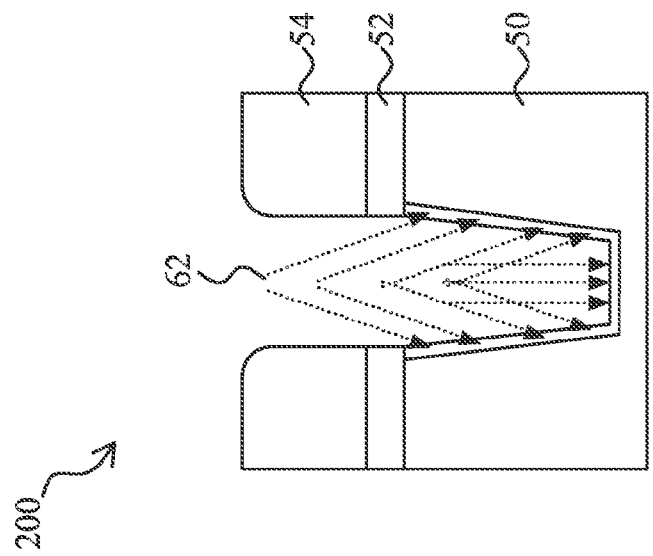

The opening film 60 may be removed by an IBE process 62 as illustrated in FIG. 10. The IBE process 62 may be similar to the IBE process 40 as described above, although the IBE process 40 and the IBE process 62 need not be the same. As illustrated in FIG. 11, substantially all of the opening film 60 is removed by the IBE process 62. The removal of the opening film 60 exposes the sidewalls of the opening 58 in the substrate 50.

At step 606 of FIG. 20, the opening 58 is filled with material 64. Step 606 is illustrated in FIG. 12 as described below.

The opening 58 may be filled with material 64 as illustrated in FIG. 12. In an embodiment, the material 64 may be a dielectric material that may be blanket deposited in the opening 58 and over the substrate 50. The semiconductor device 200 may also be referred to as a shallow trench isolation (STI). In this embodiment, the material 64 may comprise one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like and deposited through a process such as CVD, or a spin-on-glass process, although any acceptable process may be utilized. In another embodiment, the material 64 may be a conductive material, for example, a source/drain region or a well region of a FinFET or a planar transistor. In this embodiment, the material 64 may comprise silicon, germanium, polysilicon, doped polysilicon, the like, or a combination thereof and may be formed through a process such as CVD, ALD, epitaxial growth, the like, or a combination thereof.

Figure 21:
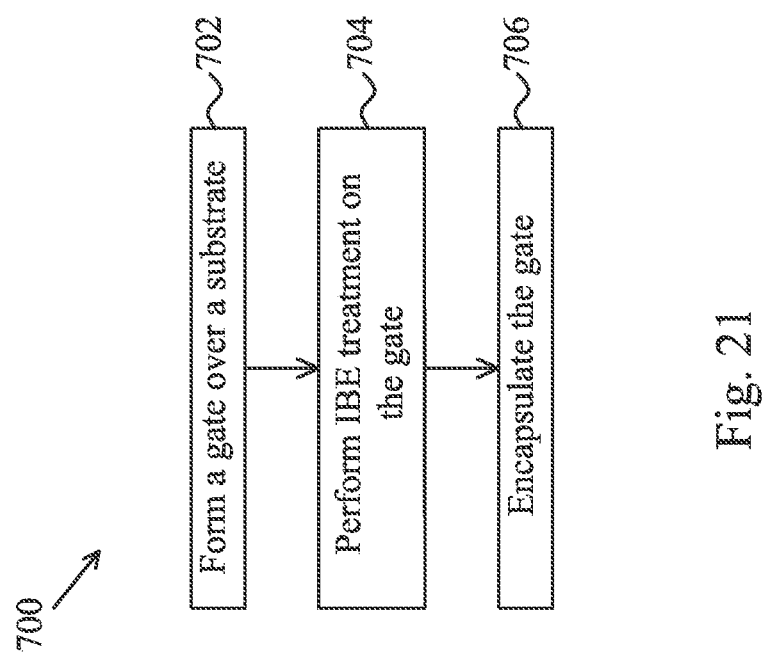
FIG. 21 illustrates a flow diagram of a method for manufacturing another semiconductor device in accordance with an embodiment.

FIG. 21 illustrates a flow diagram a method 700 for manufacturing a semiconductor device 300 in accordance with an embodiment. While method 700 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 14:
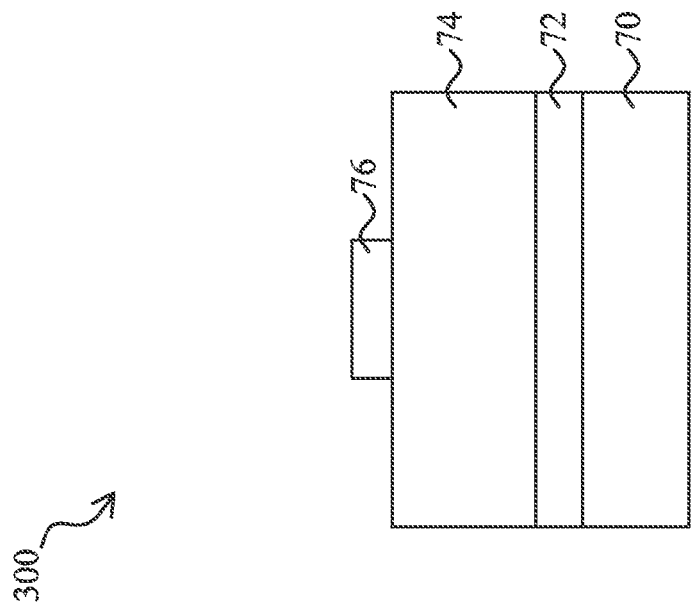

At step 702, a gate is formed over a substrate. Step 702 is illustrated in FIGS. 13 through 15 as described below.

Figure 13:
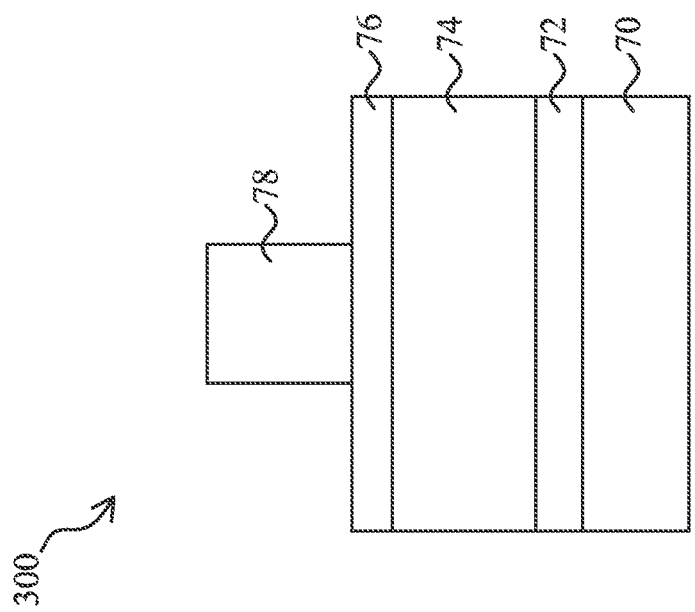

FIG. 13 illustrates a semiconductor device 300 at an intermediate stage of manufacturing. The semiconductor device 400 includes a substrate 70, a gate dielectric layer 72 over the substrate 70, a gate electrode layer 74 over the gate dielectric layer 72, a hardmask layer 76 over the gate electrode layer 74, and a photoresist 78 over the hardmask layer 76. The substrate 70 may be similar to substrate 50 described above and will not be repeated herein.

The gate dielectric layer 72 may be formed over the substrate 79 by thermal oxidation, CVD, sputtering, or any other methods known and used in the art for forming a gate dielectric. In other embodiments, the gate dielectric layer 72 may include dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer 74 may be formed over the gate dielectric layer 72. The gate electrode layer 74 may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer 74 may be deposited by CVD, sputter deposition, or other techniques known and used in the art for depositing conductive materials. The top surface of the gate electrode layer 74 usually has a non-planar top surface, and may be planarized prior to patterning of the gate electrode layer 74 or gate etch. Ions may or may not be introduced into the gate electrode layer 74 at this point. Ions may be introduced, for example, by ion implantation techniques.

The hardmask layer 76 may be formed over the gate electrode layer 74. The hardmask layer 76 may be a masking material such as poly-silicon, silicon nitride, the like, or a combination thereof and may be formed using a process such as plasma enhanced chemical vapor deposition (PECVD). However, any other suitable hardmask material, such as silicon oxide, and any other process of formation, such as CVD, may alternatively be utilized.

The photoresist 78 may be formed and patterned over the hardmask layer 76. The photoresist 78 may be similar to the photoresist 56 described above and will not be repeated herein.

As illustrated in FIG. 14, the pattern from the photoresist 78 may be transferred to the hardmask layer 76. This step may be accomplished by an etch step. The remaining portion of the hardmask layer 76 substantially aligns with the patterned photoresist 78.

FIG. 15 illustrates the transferring of the pattern from the hardmask layer 76 to the gate electrode layer 74 forming the gate 80. This step may be performed by, e.g., a dry plasma etch, with etchant gas comprising $SF_6$, $CF_4$, $CHF_3$, the like, or a combination thereof. In another embodiment, the gate dielectric layer 72 may also be etched during this etch step.

As described above in regards to the MTJ sidewall film 32, the top electrode film 34, and the opening film 60, the etching process for forming the gate 80 may form a gate film 78 on the sidewalls of the gate 80. The gate film 78 may be caused by damage from the etch process to the sidewalls of the gate 80, the oxidation of the sidewalls of the gate 80, the re-deposition of etching by-product on the sidewalls of the gate 80, or a combination thereof.

Figure 17:
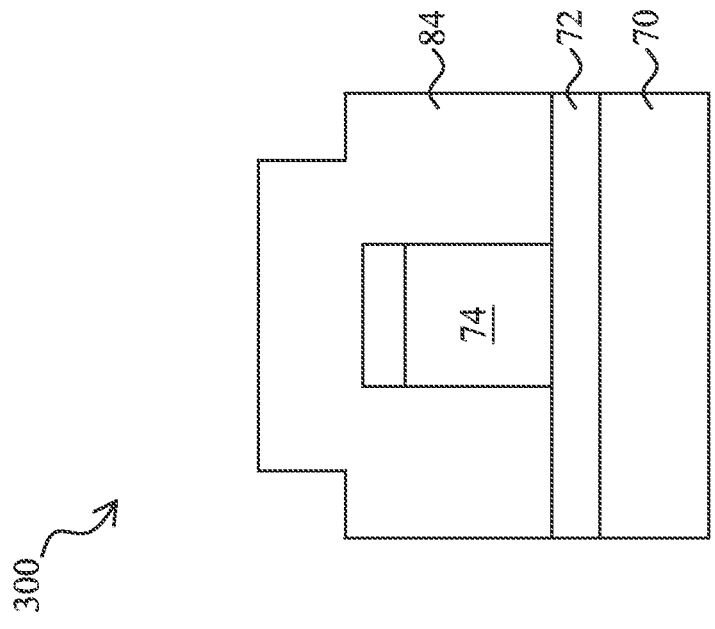

At step 704 of FIG. 21, an IBE treatment is performed on the gate 80 to remove the gate film 78. Step 704 is illustrated in FIGS. 16 and 17 as described below.

The gate film 78 may be removed by an IBE process 82 as illustrated in FIG. 16. The IBE process 82 may be similar to the IBE processes 40 and 62 as described above, although the IBE process 40, the IBE process 62, and the IBE process 82 need not be the same. As illustrated in FIG. 16, substantially all of the gate film 78 is removed by the IBE process 82. The removal of the gate film 78 exposes the sidewalls of the gate 80.

Figure 18:
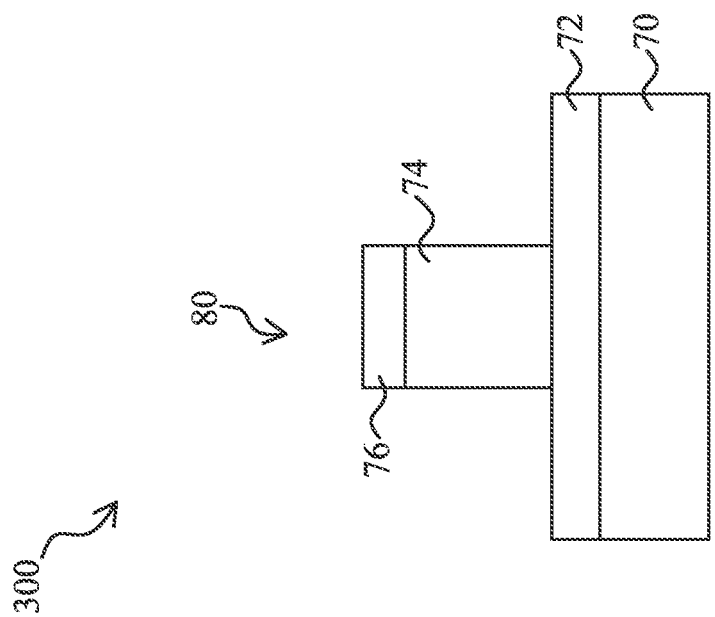

At step 706 of FIG. 21, the gate 80 is encapsulated. Step 706 is illustrated in FIG. 18 as described below.

FIG. 21 illustrated the formation of an inter-layer dielectric (ILD) 84 over the gate 80. Before the ILD 80 is formed, a contact etch stop layer (CESL) comprising silicon nitride, silicon oxide, the like, or a combination thereof may be formed over the gate 80 and the gate dielectric layer 72. In an embodiment, the ILD 84 may comprise silicon oxide, silicon nitride, the like, or a combination thereof. The ILD 84 may be formed by CVD, a high density plasma (HDP), the like, or a combination thereof. The ILD 84 may be planarized to a top surface of the gate 80 so that contacts (not shown) may be formed to the gate 80. In an embodiment, the ILD 84 is planarized by using a CMP to remove portions of the ILD 84. In other embodiments, other planarization techniques may be used, such as etching.

By performing an IBE process after a prior etching process, the damage, oxidation, and re-deposition of etch by-product may be removed. This allows for a semiconductor device, for example, an MRAM device, to have improved performance and electrical characteristics. Further, the IBE process generates a neutralization species as the etchant and will not further damage and/or oxidize the semiconductor device.

An embodiment is a method of forming a semiconductor device, the method comprising forming a second layer over a first layer, and performing a first etch process on the second layer to define a feature, wherein the first etch process forms a film on a surface of the feature. The method further comprises performing an ion beam etch process on the feature, wherein the ion beam etch removes the film from the surface of the feature.

Another embodiment is method of forming a magnetic random access memory (MRAM) device, the method comprising forming a magnetic tunnel junction (MTJ) over a bottom electrode, and forming a top electrode over the MTJ. The method further comprises patterning the top electrode and the MTJ to define a feature with a first etch process, wherein the first etch process forms a film on the feature of the top electrode and the MTJ, and performing an ion beam etch process on the feature of the top electrode and the MTJ, wherein the ion beam process removes the film.

Yet another embodiment is a method of forming a semiconductor device, the method comprising forming an opening in a substrate with a first etch process, wherein the first etch process forms a film on the interior surface of the opening, and performing an ion beam etch process in the opening, wherein the ion beam process removes the film Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a magnetic tunnel junction (MTJ) over a conductive bottom electrode;
    forming a conductive top electrode having a first width directly on the MTJ;
    performing a first etch process on the MTJ to pattern the MTJ to the first width, the first etch process forming films on surfaces of the MTJ and the top electrode; and
    performing an ion beam etch process on the MTJ and the top electrode, the ion beam etch process removing the films from the surfaces of the MTJ and the top electrode, wherein after the films are removed, the MTJ and the top electrode have a second width and third width, respectively, the second and third widths being less than the first width, the third width being less than the second width.

2. The method of claim 1, wherein the ion beam etch process has an ion beam voltage between about 100 V and about 200 V.

3. The method of claim 1, wherein the first etch process is a dry plasma etch process.

4. The method of claim 1 further comprising after the performing the ion beam etch process, depositing a dielectric layer over the MTJ and the top electrode.

5. A method of forming an magnetic random access memory (MRAM) device, the method comprising:
    forming a magnetic tunnel junction (MTJ) over a bottom electrode, wherein the forming an MTJ further comprises:
        forming an anti-ferromagnetic material (AFM) layer over the bottom electrode;
        forming a pinned layer over the AFM layer;
        forming a barrier layer over the pinned layer; and
        forming a free layer over the barrier layer;
    forming a top electrode directly on the free layer, the top electrode being conductive;
    patterning the top electrode and the MTJ with a first etch process, wherein the first etch process forms a film on the top electrode and the MTJ; and
    performing an ion beam etch process on the top electrode and the MTJ, wherein the ion beam etch process removes the film, wherein after the performing the ion beam etch process, the top electrode has a first width and the MTJ has a second width, the second width being larger than the first width.

6. The method of claim 5, wherein the ion beam etch process has an ion beam focus voltage between about 500 V and about 2000 V.

7. The method of claim 5, wherein the ion beam etch process comprises an etchant gas from a group consisting essentially of as a $CHF_2$, $CHF_3$, or $CHF_4$, Ar, O, N, or a combination thereof.

8. The method of claim 5, wherein the film is on sidewalls of the MTJ and on sidewalls and a top surface of the top electrode.

9. The method of claim 5 further comprising after the performing the ion beam etch process, forming a dielectric layer over the bottom electrode, the MTJ, and the top electrode.

10. The method of claim 5, wherein the patterning the top electrode and the MTJ with the first etch process further comprises:
    patterning the top electrode in a first plasma dry etch step; and
    patterning the MTJ in a second plasma dry etch step.

11. A method of forming an magnetic random access memory (MRAM) device, the method comprising:
    forming a magnetic tunnel junction (MTJ) over a bottom electrode;
    forming a top electrode over the MTJ;
    patterning the top electrode and the MTJ, wherein the patterning the top electrode and the MTJ forms a film on the top electrode and the MTJ; and
    performing an ion beam etch process on the top electrode and the MTJ, wherein the ion beam etch process removes the film, wherein after the performing the ion beam etch process, the top electrode has a first width and the MTJ has a second width, the second width being larger than the first width.

12. The method of claim 11, wherein the forming the MTJ further comprises:
    forming an anti-ferromagnetic material (AFM) layer over the bottom electrode;
    forming a pinned layer over the AFM layer;
    forming a barrier layer over the pinned layer; and
    forming a free layer over the barrier layer.

13. The method of claim 12, wherein the patterning the top electrode and the MTJ further comprises:
    patterning the free layer, the barrier layer, and the pinned layer with a first etch process; and
    patterning the AFM layer with a second etch process, the second etch process being a different process than the first etch process, wherein after the patterning the AFM layer with the second etch process, the AFM layer, the pinned layer, the barrier layer, and the free layer each have substantially coterminous sidewalls.

14. The method of claim 11 further comprising after the performing the ion beam etch process, forming a dielectric layer over the bottom electrode, the MTJ, and the top electrode.

15. The method of claim 11, wherein the top electrode directly contacts the MTJ.

16. The method of claim 11, wherein the ion beam etch process has an ion beam focus voltage between about 500 V and about 2000 V.

17. The method of claim 11, wherein the ion beam etch process comprises an etchant gas from a group consisting essentially of as a $CHF_2$, $CHF_3$, or $CHF_4$, Ar, O, N, or a combination thereof.

18. The method of claim 13, wherein the first etch process is a dry plasma etch process, and wherein the second etch process is a dry plasma etch process.

19. The method of claim 11, wherein the top electrode and the bottom electrode are each formed of a conductive material.

20. The method of claim 5, wherein the patterning the top electrode and the MTJ with a first process further comprises:
    patterning the free layer, the barrier layer, and the pinned layer with a first plasma dry etch process; and
    patterning the AFM layer with a second plasma dry etch process, the second plasma dry etch process being a different process than the first dry etch process, wherein after the patterning the AFM layer with the second plasma dry etch process, the AFM layer, the pinned layer, the barrier layer, and the free layer each have substantially coterminous sidewalls.

* * * * *